(12) United States Patent
Kang

(10) Patent No.: US 7,573,777 B2
(45) Date of Patent: Aug. 11, 2009

(54) OVER DRIVER CONTROL SIGNAL GENERATOR IN SEMICONDUCTOR MEMORY DEVICE

(75) Inventor: Khil-Ohk Kang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 223 days.

(21) Appl. No.: 11/823,373

(22) Filed: Jun. 26, 2007

(65) Prior Publication Data

US 2008/0079472 A1   Apr. 3, 2008

(30) Foreign Application Priority Data

Oct. 2, 2006   (KR) ................. 10-2006-0096955
Oct. 2, 2006   (KR) ................. 10-2006-0096957

(51) Int. Cl.
  *G11C 8/00*   (2006.01)
(52) U.S. Cl. .................. 365/230.06; 365/189.07; 365/189.09; 365/194; 365/226
(58) Field of Classification Search .......... 265/226; 365/230.06, 189.07, 189.09, 194
  See application file for complete search history.

(56) References Cited

U.S. PATENT DOCUMENTS

| | | | |
|---|---|---|---|
| 5,889,719 A * | 3/1999 | Yoo et al. ............ | 365/226 |
| 6,347,058 B1 | 2/2002 | Houghton et al. | |
| 6,853,593 B1 * | 2/2005 | Bae ................ | 365/189.09 |
| 7,020,043 B1 | 3/2006 | Lee | |
| 7,038,757 B2 | 5/2006 | Park et al. | |
| 7,158,430 B2 | 1/2007 | Byun | |
| 2006/0267630 A1 | 11/2006 | Matsui | |
| 2006/0268630 A1 | 11/2006 | Park et al. | |

FOREIGN PATENT DOCUMENTS

| | | |
|---|---|---|
| JP | 11-273346 | 10/1999 |
| JP | 2006-286163 | 10/2006 |
| JP | 2006-309926 | 11/2006 |
| KR | 2003-0047013 | 6/2003 |
| KR | 10-2005-0079179 | 8/2005 |
| KR | 10-0571648 | 4/2006 |

* cited by examiner

*Primary Examiner*—Son Dinh
(74) *Attorney, Agent, or Firm*—Blakely, Sokoloff, Taylor & Zafman LLP

(57) ABSTRACT

An over-driver control signal generating apparatus includes a pulse generating unit for generating a pulse signal having a pulse width corresponding to a desired over-driving interval in response to an over-driving signal; a supply voltage level detecting unit for detecting a voltage level of a supply voltage to generate a detecting signal; and a selecting unit for outputting the pulse signal as a bit line over-driver control signal in response to the detecting signal.

19 Claims, 10 Drawing Sheets

OVER DRIVER CONTROL SIGNAL GENERATOR IN SEMICONDUCTOR MEMORY DEVICE

CROSS-REFERENCES TO RELATED APPLICATIONS

The present invention claims priority of Korean patent application numbers 10-2006-96955 and 10-2006-96957, filed on Oct. 2, 2006, which are incorporated by references in their entirety.

BACKGROUND OF THE INVENTION

The present invention relates to a bit line over-driving scheme in a semiconductor memory device, and more particularly, an over-driving pulse generating circuit for controlling an over-driver.

As a continuous scale-down with respect to a line width and size of cells constituting a semiconductor memory chip has progressed, a voltage lowering of a power supply voltage has accelerated, and accordingly, there has been a demand for a design technique for satisfying a performance required under low power voltage condition.

Now, most semiconductor memory chips are equipped with an internal voltage generator for generating an inner voltage to supply itself with a voltage required for operating an internal circuit in a chip. In a case of a memory device, inter alia, employing a bit line sensing amplifier, such as a dynamic random access memory (DRAM), a core voltage VCORE is used for sensing a cell data.

When a word line selected by a row address is activated, data from a plurality of memory cells connected to the word line is transmitted to a bit line and the bit line sensing amplifier senses and amplifies a voltage difference between bit line pair. Typically, there are thousands of bit line sensing amplifiers, which may be simultaneously operated, in a semiconductor memory chip. In such a case, much current is consumed in a core voltage stage used to drive a pull-up supply line (usually, referred to as RTO) of the bit line sensing amplifiers. It is, however, difficult to amplify data in a great deal of cells by using the core voltage VCORE for short time in a trend in lowering an operational voltage.

In order to solve the above problem, in an initial operation of the bit line sensing amplifier, i.e., directly after sharing charges between the memory cells and the bit line, an over-driving scheme for the bit line sensing amplifier is employed to drive the RTO of the bit line sensing amplifier in a higher voltage (usually, a power supply voltage VDD) than the core voltage VCORE for a constant time period.

FIG. 1 shows a block diagram for illustrating a configuration of a bit line sensing amplifier array employing an over-driving scheme.

As shown, the bit line sensing amplifier array includes a bit line sensing amplifier 30, an upper bit line separating unit 10, a lower bit line separating unit 50, a bit line equalizing/pre-charging unit 20, a column selecting unit 40, and a bit line sensing amplifier (BLSA) supply line driving unit 60, without respect of employing the over-driving scheme.

The upper bit line separating unit 10 decouples and couples an upper memory cell array and the bit line sensing amplifier 30 in response to an upper separate signal BISH, and the lower bit line separating unit 50 decouples and couples a lower memory cell array and the bit line sensing amplifier 30 in response to a lower separate signal BISL.

The bit line sensing amplifier 30 senses a voltage difference between a bit line pair BL and BLB, the bit line pair having a fine voltage difference in a charge sharing state, when an enable signal is activated to drive a pull-down supply line (usually, referred to as a SB) and a pull-up supply line (usually, referred to as a RTO) to a predetermined voltage level. Further, it amplifies one of the supply lines to have a ground voltage VSS and the other of them to have a core voltage VCORE.

The bit line equalizing/pre-charging unit 20 pre-charges the bit line pair BL and BLB to a bit line pre-charge voltage VBLP, usually a half of the core voltage VCORE (VCORE/2), in response a bit line equalizing signal BLEQ, after completing sensing, amplifying and restoring processes with respect to the bit lines.

The column selecting unit 40 transmits data sensed and amplified by the bit line sensing amplifier 30 to segment data buses SIO and SIOB, in response to a column selective signal YI, when a read command is applied thereto.

The BLSA supply line driving unit 60 has a P-type metal-oxide semiconductor (PMOS) transistor M2 for driving the RTO to the core voltage VCORE in response to a pull-up supply line driving control signal SAP, an N-type metal-oxide semiconductor (NMOS) transistor M3 for driving the SB to the ground voltage VSS in response to a pull-down supply line driving control signal SAN, a PMOS transistor M1 as an over-driver for driving the core voltage VCORE to the power supply voltage VDD in response to an over-driving pulse SAOVDP (i.e., an over-driver control signal), and a BLSA supply line equalizing/pre-charging section 62 for pre-charging the RTO and SB of the bit line sensing amplifier 30 to a bit line pre-charge voltage VBLP in response to the bit line equalizing signal BLEQ.

While, for the convenience of the explanation, the over-driving pulse SAOVDP is defined as a low active pulse and the over-driver enabled by the over-driving pulse SAOVDP is implemented by the PMOS transistor M1, an NMOS transistor may be used as the over-driver instead of the PMOS transistor M1. Similarly, an NMOS transistor may be replaced with the PMOS transistor M2 controlled by the pull-up supply line driving control signal SAP.

FIG. 2 shows a block diagram of an over-driving pulse output unit for generating the over-driving pulse SAOVDP.

As shown, the over-driving pulse output unit includes an enable signal generator 200, supply line driving control signal generator 210, and an over-driving pulse generator 220.

The enable signal generator 200 generates a BLSA enable signal SAEN in response to an active command ACT and a pre-charge command PCG. The supply line driving control signal generator 210 generates a pull-up supply line driving control signal SAP, a pull-down supply line driving control signal SAN and an over-driving signal OVD by using the BLSA enable signal SAEN. The over-driving pulse generator 220 for receiving the over-driving signal OVD to generate the over-driving pulse SAOVDP.

FIG. 3 shows a circuit diagram for illustrating a configuration of the over-driving pulse generator 220 shown in FIG. 2.

The over-driving pulse generator 220 includes a delay section and a NOR gate NOR10. The delay section delays the over-driving signal OVD by a predetermined time period. The NOR gate NOR10 performs a NOR operation on a delayed over-driving signal output from the delay section and the over-driving signal OVD to output the over-driving pulse SAOVDP.

FIG. 4 is a waveform diagram illustrating signals output from the over-driving pulse generator 220 shown in FIG. 3.

Hereinafter, an operation of the BLSA supply line driving unit 60 is described.

The active command ACT is applied to activate a word line and data stored in a cell is deserted into a bit line pair BL and BLB by a charge sharing. After a predetermined time period, the pull-up supply line driving control signal SAP is activated with a logic low level and the pull-down supply line driving control signal SAN is activated with a logic high level. In this case, the RTO is over-driven by the over-driving pulse SAOVDP activated with a logic low level by receiving the active command ACT before (at least simultaneously with) the pull-up and pull-down supply line driving control signals SAP and SAN. That is, when all of the pull-up and pull-down supply line driving control signals SAP and SAN and the over-driving pulse SAOVDP are activated, the transistors M1, M2 and M3 are respectively turned on to drive the RTO to a supply voltage VDD and the SB to a ground voltage VSS.

Thereafter, after passing a predetermined time period, the over-driving pulse SAOVDP is deactivated with a logic high level to drive the RTO to the core voltage VCORE. Then when a pre-charge command PCG is applied thereto, the pull-up and pull-down supply line driving control signals SAP and SAN are deactivated, and the RTO and the SB are precharged to a bit line pre-charge voltage VBLP by the BLSA supply line equalizing/pre-charging section 62. The bit line pre-charge voltage VBLP typically has a voltage level of a half of the core voltage VCORE, i.e., VCORE/2.

FIG. 5 is a simulation showing voltage and current changes according to the over-driving pulse SAOVDP under various power supply voltage conditions.

Under low power voltage condition where the power supply voltage VDD is about 1.6V and the core voltage VCORE is about 1.5V, there appear few problems in an over-driving operation of the over-driver. This is because a trend in a voltage lowering in a semiconductor memory device is considered at a design process and a size of the transistor M1 as an over-driver is also designed to apply a proper amount of current into the core voltage VCORE under the low voltage condition.

However, under high power voltage condition where the power supply voltage VDD is about 2V, the transistor M1 of the BLSA supply line driving unit 60 supplies an excessive current to the core voltage VCORE during an over-driving interval, such that the core voltage VCORE suddenly increases in its voltage level to thereby have an excessive voltage level. In case where a voltage level of the core voltage VCORE excessively rises as described above, there occurs a problem that an operational characteristic degrades to incur a poor device.

Meanwhile, as shown in FIG. 5, the over-driving pulse SAOVDP has a short active interval, i.e., a pulse width, under the high power voltage condition in comparison to that under low power voltage condition. This is because a propagation delay is decreased as the power voltage is increased. However, an effect thereof is insignificant.

SUMMARY OF THE INVENTION

It is, therefore, an object of the present invention to provide an over-driver control signal generating unit in a semiconductor memory device, capable of procuring a stable voltage level in a normal driving voltage stage without respect to a voltage level of a power supply voltage.

In accordance with an aspect of the present invention, there is provided an over-driver control signal generating apparatus, including: a pulse generating unit for generating a pulse signal having a pulse width corresponding to a desired over-driving interval in response to an over-driving signal; a supply voltage level detecting unit for detecting a voltage level of a supply voltage to generate a detecting signal; and a selecting unit for outputting the pulse signal as a bit line over-driver control signal in response to the detecting signal.

In accordance with another aspect of the present invention, there is provided an over-driver control signal generating method, including: generating a first pulse signal having a first pulse width in response to an over-driving signal; generating a second pulse signal of a second pulse width shorter than the first pulse width in response to the over-driving signal; detecting a voltage level of a supply voltage; and alternatively outputting the first pulse signal or the second pulse signal as a bit line over-driver control signal in response to a detected result of the supply voltage.

In accordance with still another aspect of the present invention, there is provided an over-driver control signal generating method, including: generating a pulse signal having a pulse width corresponding to a desired over-driving interval in response to an over-driving signal; detecting a voltage level of a supply voltage; and outputting the pulse signal as a bit line over-driver control signal in response to a detected result of the supply voltage.

In a first preferred embodiment of the present invention, an over-driving interval is set to be relatively long under low voltage condition and to be relatively short under high voltage condition. To this end, the present invention includes a first and a second pulse generating unit having different delay values and multiplexes a pulse width of an over-driver control signal based on a detected result of supply voltage VDD level.

Further, in a second preferred embodiment of the present invention, an over-driving is executed under low voltage condition and is not executed under high voltage condition. To this end, the present invention detects a supply voltage VDD level and determines the execution of the over-driving based on the detected result of a supply voltage VDD level.

DESCRIPTION OF SPECIFIC EMBODIMENTS

Hereinafter, an over-driving pulse generating circuit in accordance with exemplary embodiments of the present invention will be described in detail with reference to the accompanying drawings.

Figure 6:
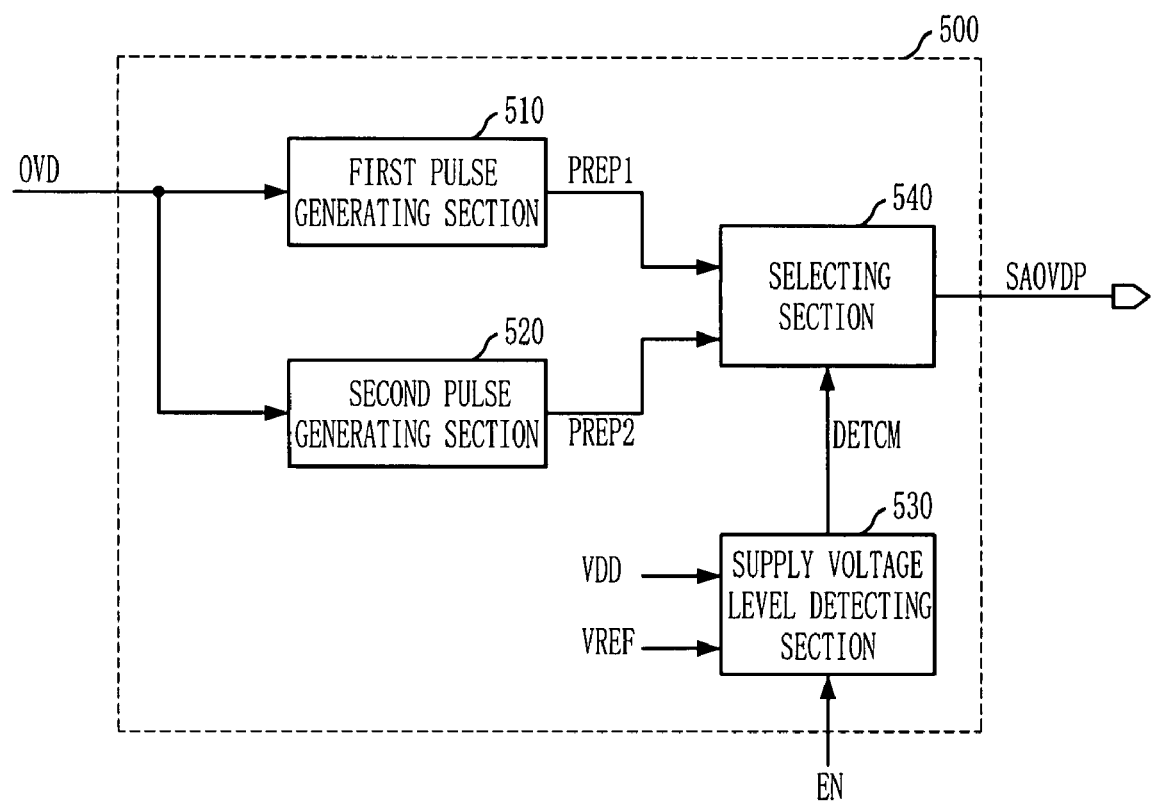
FIG. 6 is a block diagram of an over-driving pulse generating unit in a semiconductor memory device in accordance with a first preferred embodiment of the present invention.

FIG. 6 shows a block diagram of an over-driving pulse generating unit 500 in a semiconductor memory device in accordance with a first preferred embodiment of the present invention.

The over-driving pulse generating unit 500 in accordance with the first preferred embodiment of the present invention includes a first pulse generating section 510, a second pulse generating section 520, a supply voltage level detecting section 530, and a selecting section 540.

The first pulse generating section 510 generates a first pulse signal PREP1 having a first pulse width in response to an over-driving signal OVD generated by an active command ACT. The second pulse generating section 520 generates a second pulse signal PREP2 having a second pulse width shorter than the first pulse width in response to the over-driving signal OVD. The supply voltage level detecting section 530 detects a voltage level of a power supply voltage VDD to generate a detecting signal DETCM. The selecting section 540 alternatively outputs one of the first pulse signal PREP1 and the second pulse signal PREP2 as an over-driving pulse SAOVDP in response to the detecting signal DETCM output from the supply voltage level detecting section 530.

Figure 7:
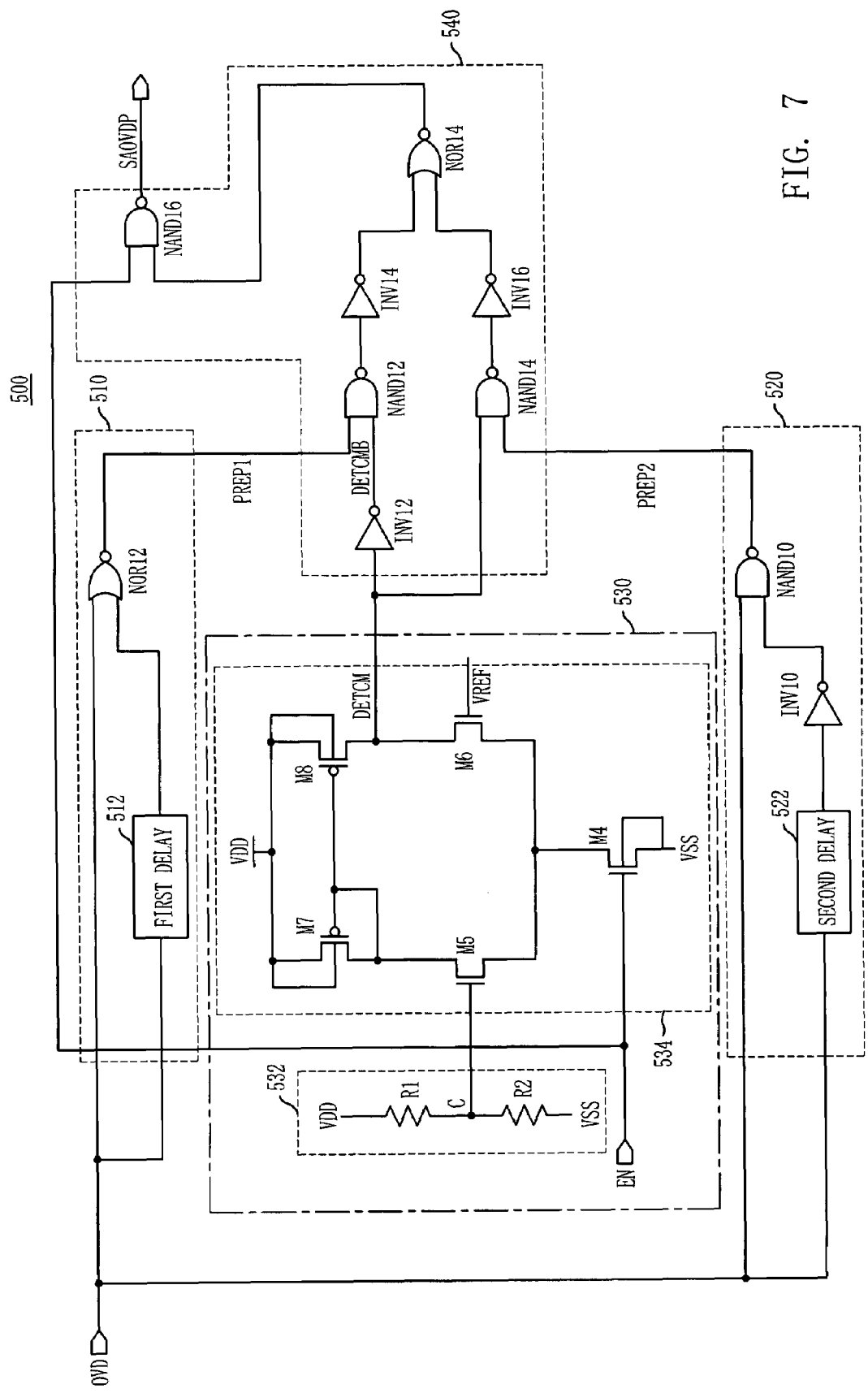
FIG. 7 is a detailed circuit diagram of an over-driving pulse generating unit shown in FIG. 6.

FIG. 7 shows a detailed circuit diagram of the over-driving pulse generating unit 500 shown in FIG. 6.

Figure 1:
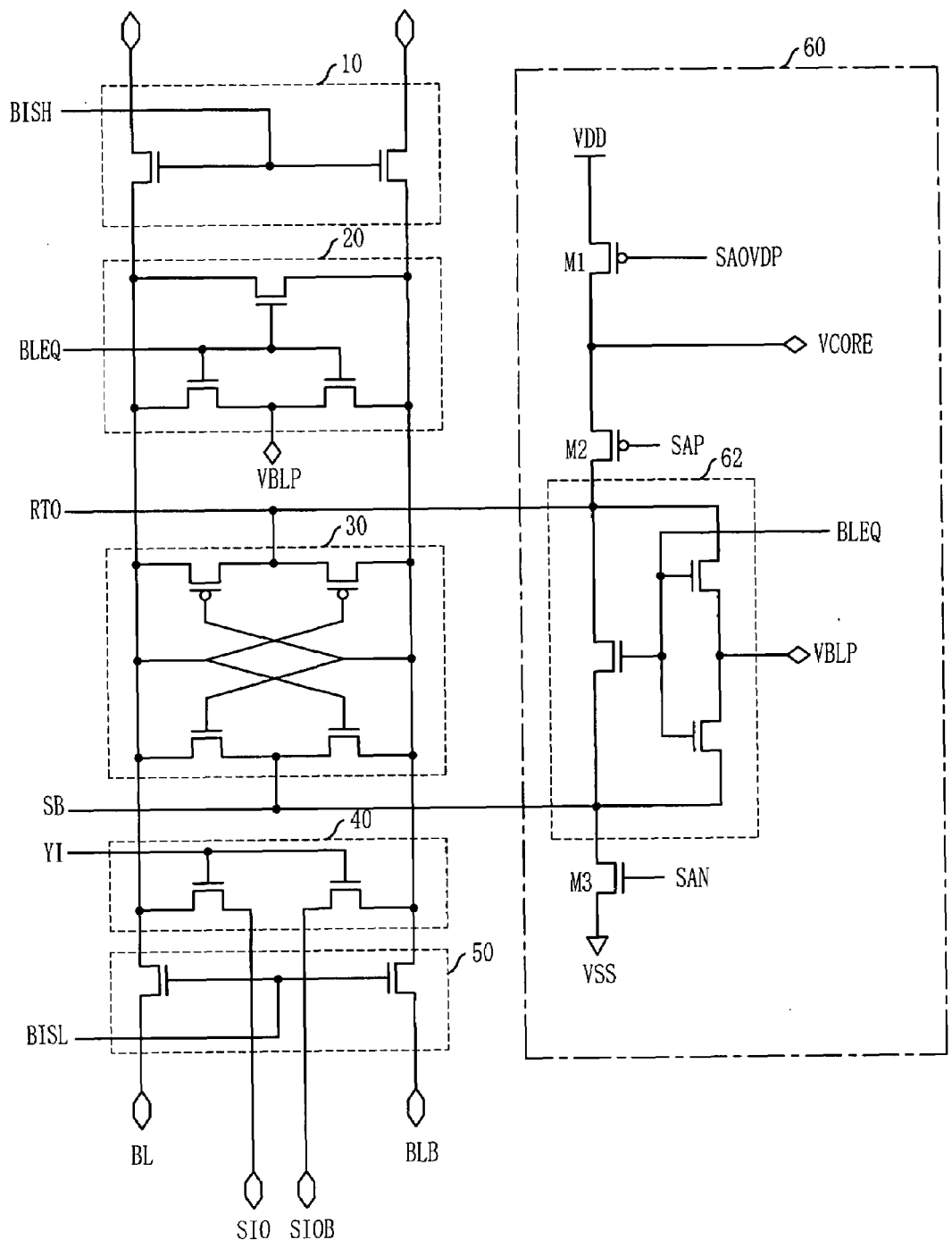
FIG. 1 is a block diagram for illustrating a configuration of a bit line sensing amplifier array employing an over-driving scheme.
Figure 2:
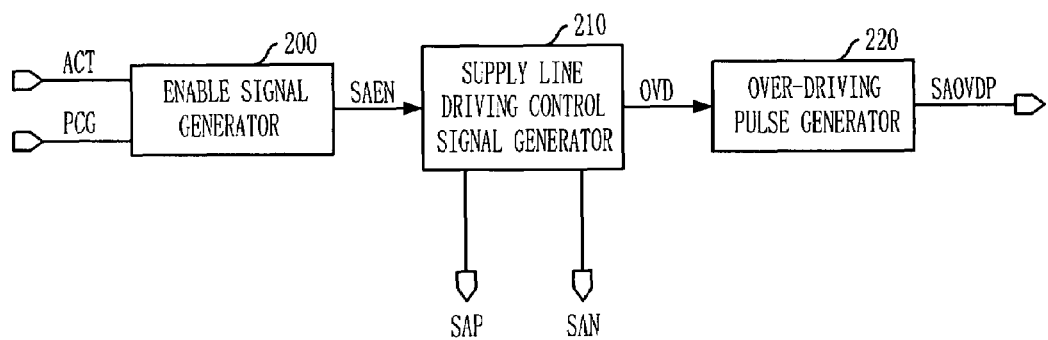
FIG. 2 is a block diagram of an over-driving pulse generating unit for generating an over-driving pulse.
Figure 3:
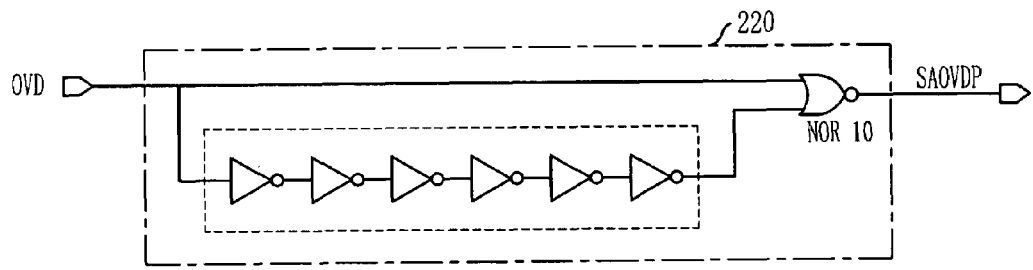
FIG. 3 is a circuit diagram for illustrating a conventional over-driving pulse generator shown in FIG. 2.
Figure 4:
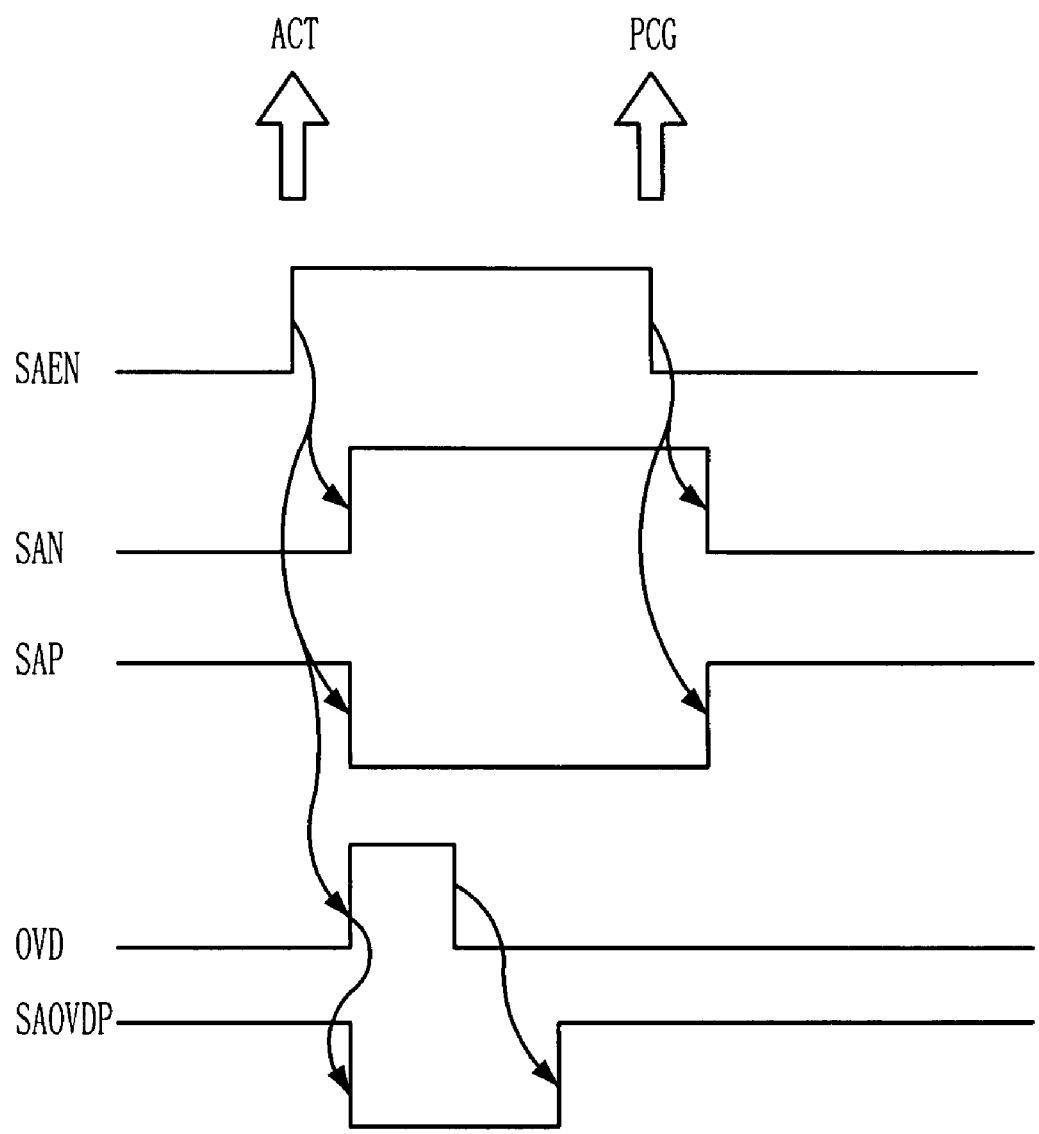
FIG. 4 is a waveform diagram illustrating signals output from the over-driving pulse generator shown in FIG. 3.
Figure 5:
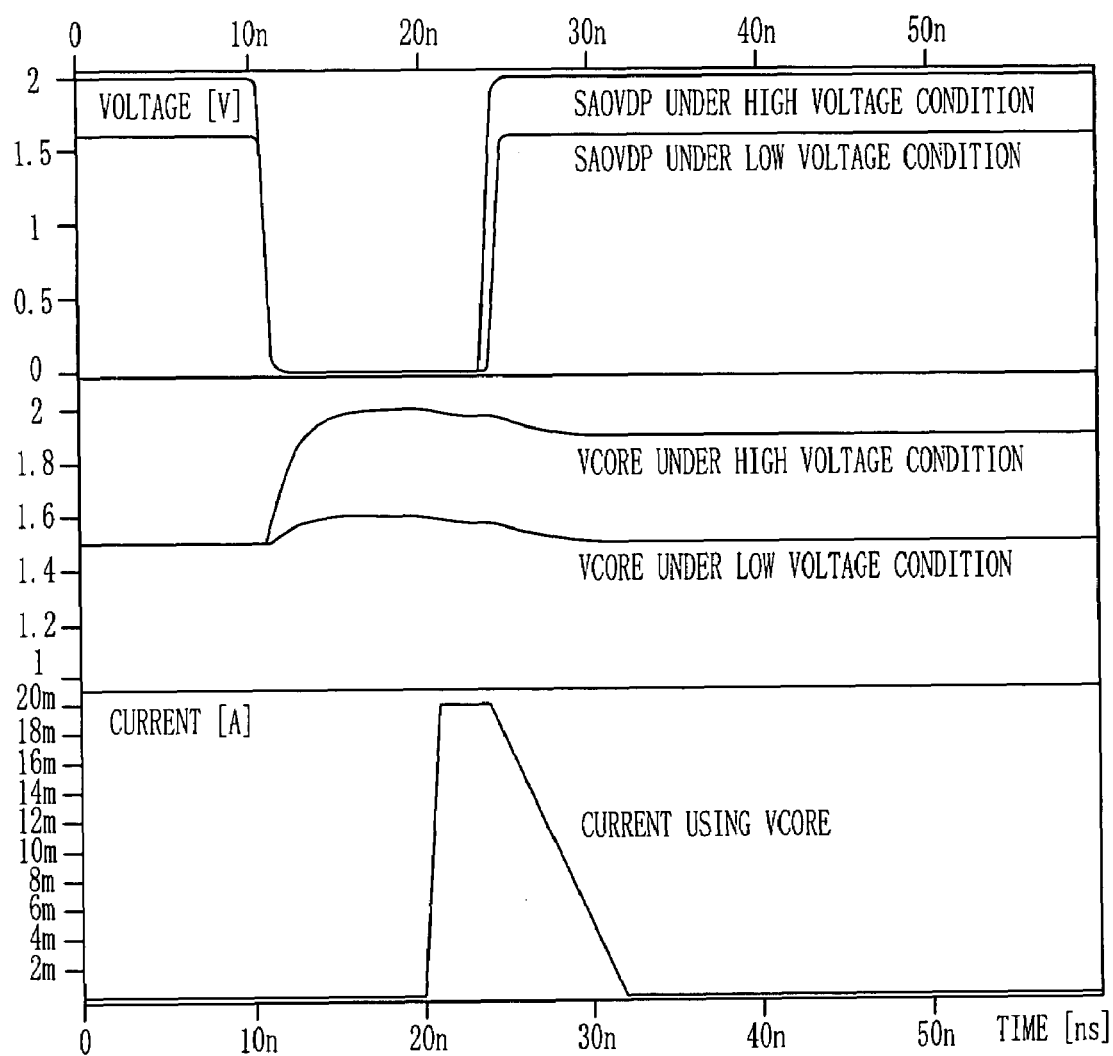
FIG. 5 is a simulation showing voltage and current changes according to an over-driving pulse under various power supply voltage conditions.

The first pulse generating section 510 has a first delay 512 for delaying the over-driving signal OVD, and a first NOR gate NOR12 for performing a NOR operation on the over-driving signal OVD and an output signal of the first delay 512 to output the first pulse signal PREP1. The structure of the first pulse generating section 510 is similar to that of the over-driving pulse generator 220 shown in FIG. 3 described above, wherein the first delay 512 has a delay time corresponding to an interval which subtracts a pulse width of the over-driving signal OVD from a desired pulse width of the first pulse signal PREP1.

Further, the second pulse generating section 520 has a second delay 522 for delaying the over-driving signal OVD, a first inverter INV10 for inverting an output signal of the second delay 522, and a first NAND gate NAND10 for performing a NOR operation to the over-driving signal OVD and an output signal of the first inverter INV10 to output the second pulse signal PREP2. The second delay 522 of the second pulse generating section 520 has a delay time corresponding to a desired pulse width of the second pulse signal PREP2.

The supply voltage level detecting section 530 has a voltage divider 532 for dividing the power supply voltage VDD by a predetermined ratio, and a comparator 534 for comparing a voltage across an output node C of the voltage divider 532 and a reference voltage VREF in response to an enable signal EN.

In detail, the voltage divider 532 includes first and second resistors R1 and R2 connected in series between the power supply voltage VDD and a ground voltage VSS. The comparator 534 is implemented with a bias NMOS transistor M4, input NMOS transistors M5 and M6, load PMOS transistors M7 and M8 for loads of a current mirror, in a form of a typical NMOS bias type of current mirror differential amplifier circuit. If the first and second resistors R1 and R2 of the voltage divider 532 have the same resistance, the reference voltage VREF may be a target voltage of a half of the power supply voltage VDD, i.e., VDD/2.

The selecting section 540 includes second to fourth inverters INV12, INV14 and INV16, second to fourth NAND gates NAND12, NAND14 and NAND16, and a second NOR gate NOR14.

The second inverter INV12 inverts the detecting signal DETCM output from the supply voltage level detecting section 530 to output an inverted detecting signal DETCMB. The second NAND gate NAND12 performs a NAND operation on the inverted detecting signal DETCMB and the first pulse signal PREP1 output from the first pulse generating section 510. The third inverter INV14 inverts an output signal of the second NAND gate NAND12. The third NAND gate NAND14 performs a NAND operation on the detecting signal DETEM and the second pulse signal PREP2 output from the second pulse generating section 520. The fourth inverter INV16 inverts an output signal of the third NAND gate NAND14. The second NOR gate NOR14 performs a NOR operation on output signals of the third and fourth inverters INV14 and INV16. The fourth NAND gate NAND16 performs a NAND operation on an output signal of the second NOR gate NOR14 and the enable signal EN to output the over-driving pulse SAOVDP.

Figure 8:
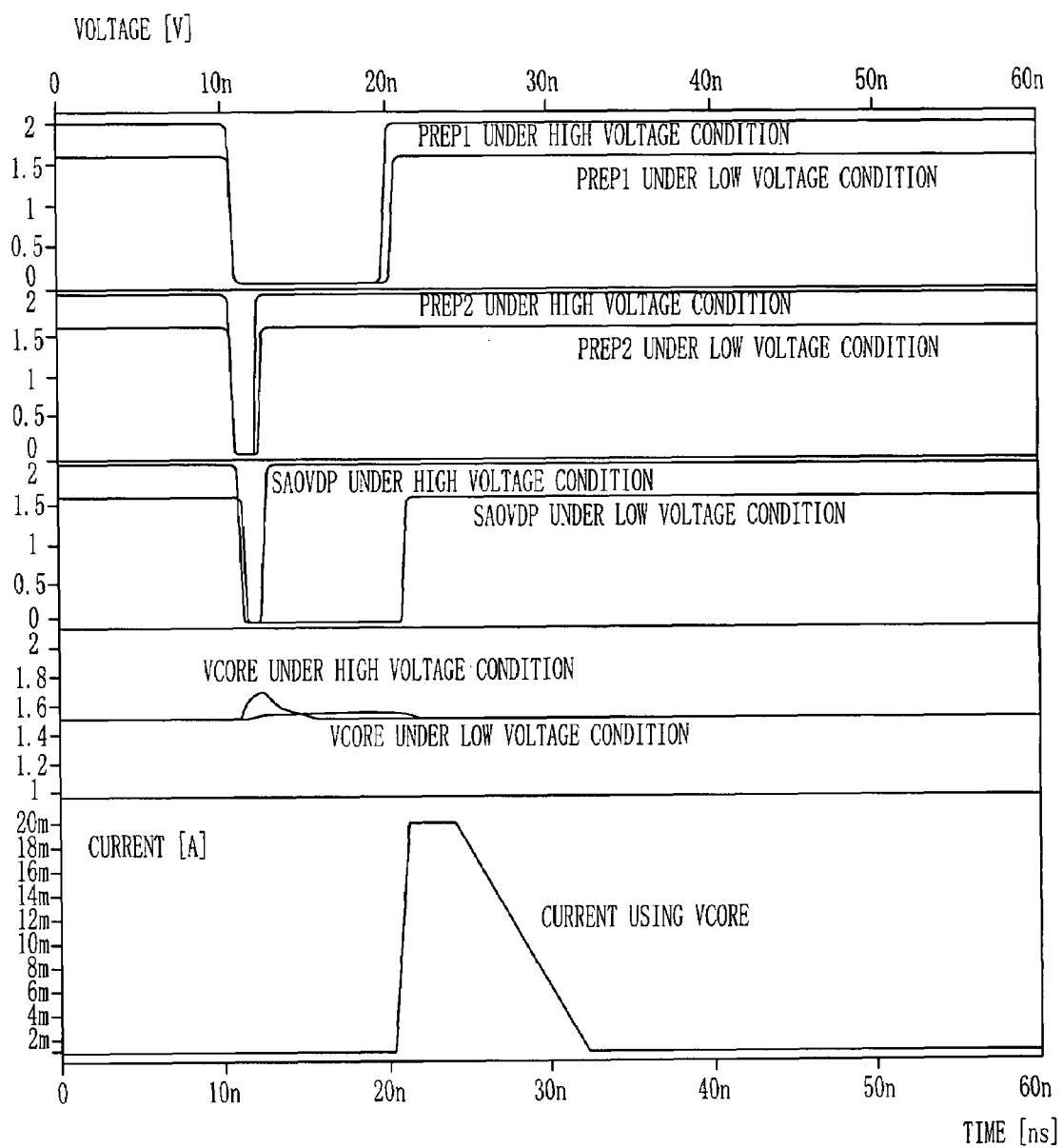
FIG. 8 is a simulation showing voltage and current changes according to an over-driving pulse output from the over-driving pulse generating unit shown in FIG. 7 under various power supply voltage conditions.

FIG. 8 shows a simulation showing voltage and current changes according to the over-driving pulse SAOVDP output from the over-driving pulse generating unit shown in FIG. 7 under various power supply voltage conditions.

It is assumed that the high power supply voltage is set to 2V, i.e., VDD=2V, the low power supply voltage is set to 1.6V, i.e., VDD=1.6V, and the reference voltage VREF is set to 0.8V to adjust the predetermined ratio of the first resistor R1 to the second resistor R2 such that the output node C of the voltage divider 532 has the same level as the reference voltage VREF, i.e., 0.8V when VDD=1.8V.

The enable signal EN is deactivated with a logic low level when a semiconductor memory device is under an idle state, and activated with a logic high level when the semiconductor memory device is under an active state. Under the idle state where the enable signal EN is deactivated with a logic low level, the over-driving pulse SAOVDP is always deactivated with a logic high level.

Referring to FIG. 8, under low voltage condition, i.e., VDD=1.6V, the detecting signal DETCM output from the supply voltage level detecting section 530 has a logic low level. Therefore, when the enable signal EN is activated with a logic high level, the selecting section 540 blocks the second pulse signal PREP2 and selects the first pulse signal PREP1 to output it as the over-driving pulse SAOVDP.

As shown in FIG. 8, the first pulse signal PREP1 has a pulse width larger than that of the second pulse signal PREP2 to procure a sufficient over-driving interval and thus can fully drive the core voltage VCORE even under the low voltage condition.

Meanwhile, under high voltage condition, i.e., VDD=2V, the detecting signal DETCM output from the supply voltage level detecting section 530 has a logic high level. Therefore, when the enable signal EN is activated with a logic high level, the selecting section 540 blocks the first pulse signal PREP1 and selects the second pulse signal PREP2 to output it as the over-driving pulse SAOVDP.

As shown in FIG. 8, the second pulse signal PREP2 has a pulse width shorter than that of the first pulse signal PREP1 to achieve a narrow over-driving interval and thus can prevent the core voltage VCORE from an excessive potential increase under the high voltage condition.

Figure 9:
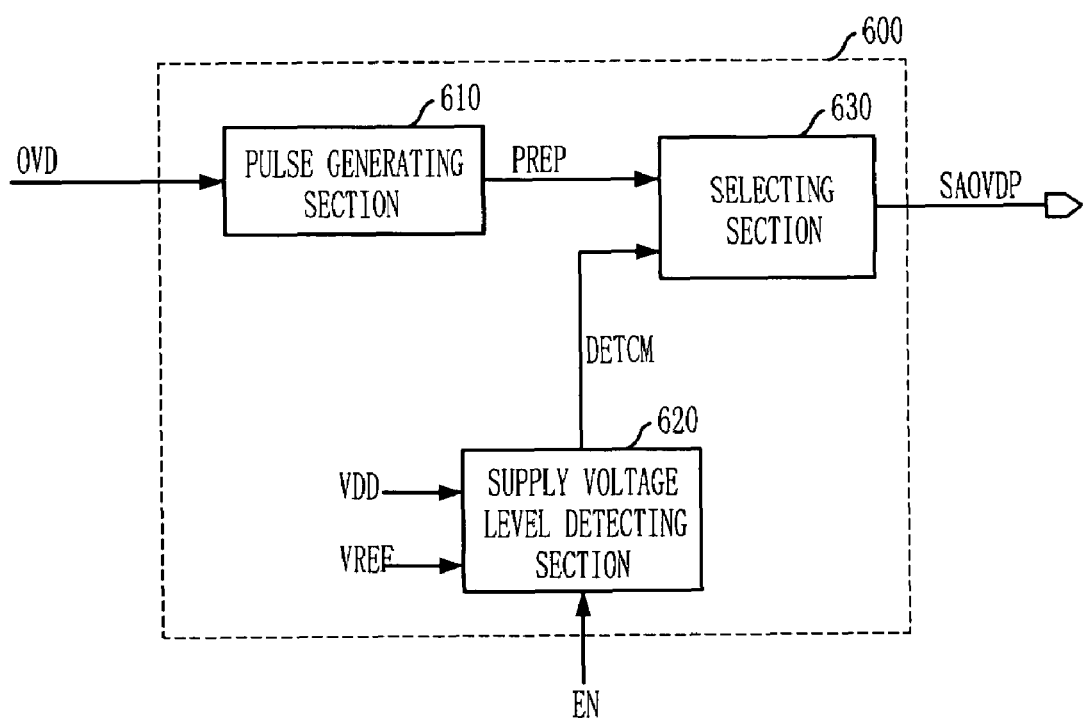
FIG. 9 is a block diagram of an over-driving pulse generating unit in a semiconductor memory device in accordance with a second preferred embodiment of the present invention.

FIG. 9 shows a block diagram of an over-driving pulse generating unit in a semiconductor memory device in accordance with a second preferred embodiment of the present invention.

The over-driving pulse generating unit 600 in accordance with the second preferred embodiment of the present invention includes a pulse generating section 610, a supply voltage level detecting section 620 and a selecting section 630.

The pulse generating section 610 generates a pulse signal PREP of a pulse width corresponding to a desired over-driving interval in response to an over-driving signal OVD generated by an active command ACT. The supply voltage level detecting section 620 detects a voltage level of a power supply voltage VDD to generate a detecting signal DETCM. The selecting section 630 outputs or blocks the pulse signal PREP as an over-driving pulse SAOVDP in response to the detecting signal DETCM output from the supply voltage level detecting section 620.

Figure 10:
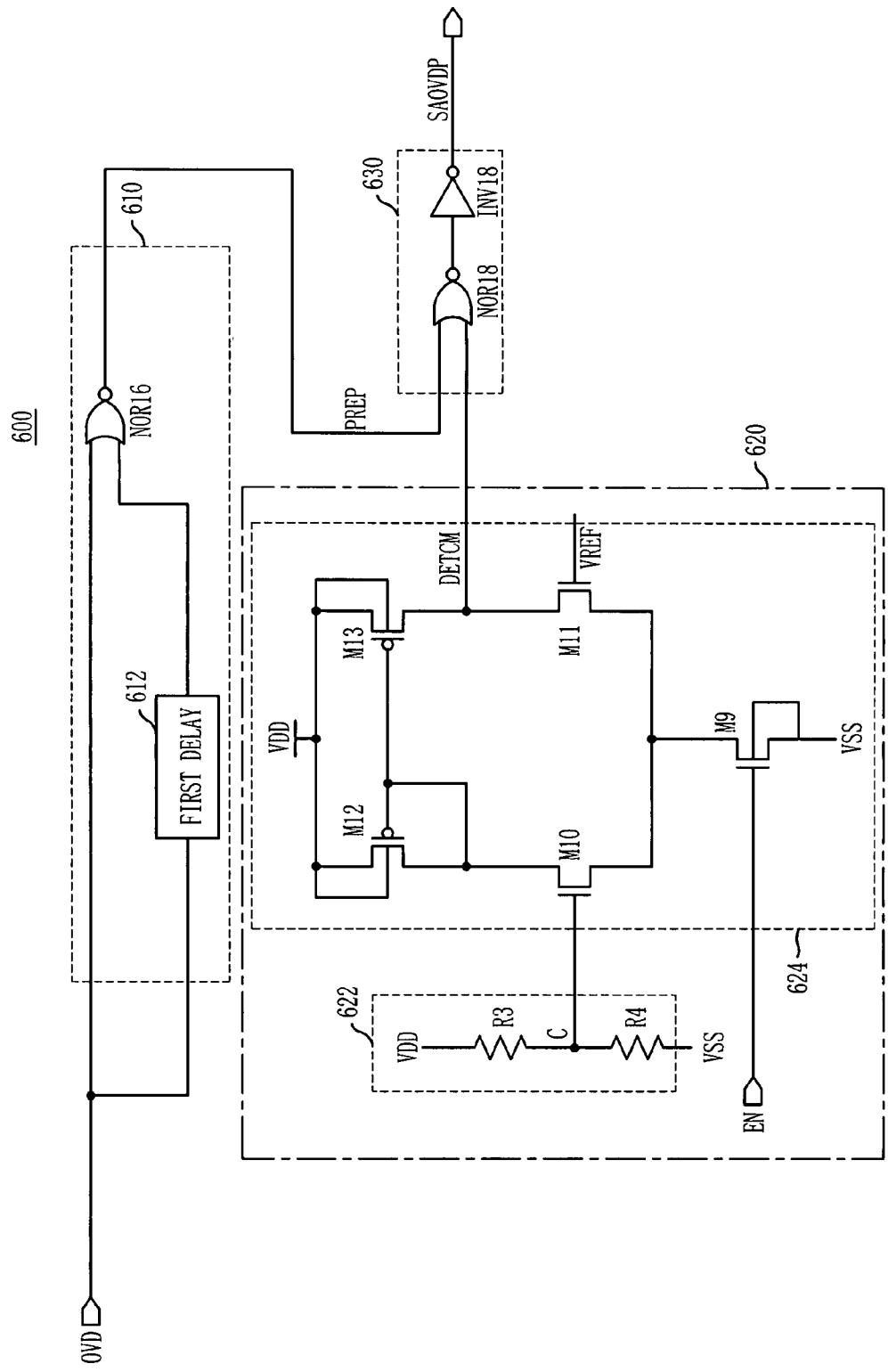
FIG. 10 is a detailed circuit diagram of the over-driving pulse generating unit shown in FIG. 9.

FIG. 10 shows a detailed circuit diagram of the over-driving pulse generating unit 600 shown in FIG. 9.

The pulse generating section 610 has a delay 612 and a first NOR gate NOR16. The delay 612 delays the over-driving signal OVD. The first NOR gate NOR16 performs a NOR operation to the over-driving signal OVD and an output signal of the delay 612 to output the pulse signal PREP. That is to say, the structure of the pulse generating section 610 is similar to that of the over-driving pulse generator 220 shown in FIG. 3, wherein the delay 612 has a delay time corresponding to an interval which subtracts a pulse width of the over-driving signal OVD from a desired pulse width of the pulse signal PREP.

The supply voltage level detecting section 620 has a voltage divider 622 and a comparator 624. The voltage divider 622 divides the power supply voltage VDD by a predetermined ratio. The comparator 624 compares a voltage across an output node C of the voltage divider 622 and a reference voltage VREF in response to an enable signal EN. The voltage divider 622 consists of first and second resistors R3 and R4 connected in series between the power supply voltage VDD and a ground voltage VSS. The comparator 624 may be implemented by a bias NMOS transistor M9, input NMOS transistors M10 and M11, load PMOS transistors M12 and M13 for loads of a current mirror, in a form of a typical NMOS bias type of current mirror differential amplifier circuit. If the first and second resistors R3 and R4 of the voltage divider 622 have the same resistance, the reference voltage VREF may be a target voltage of a half of the power supply voltage VDD, i.e., VDD/2.

The selecting section 630 has a second NOR gate NOR18 and an inverter INV18. The second NOR gate NOR18 performs a NOR operation on the detecting signal DETCM output from the supply voltage level detecting section 620 and the pulse signal PREP output from the pulse generating section 610. The inverter INV18 inverts an output signal of the second NOR gate NOR18 to output the over-driving pulse SAOVDP.

Figure 11:
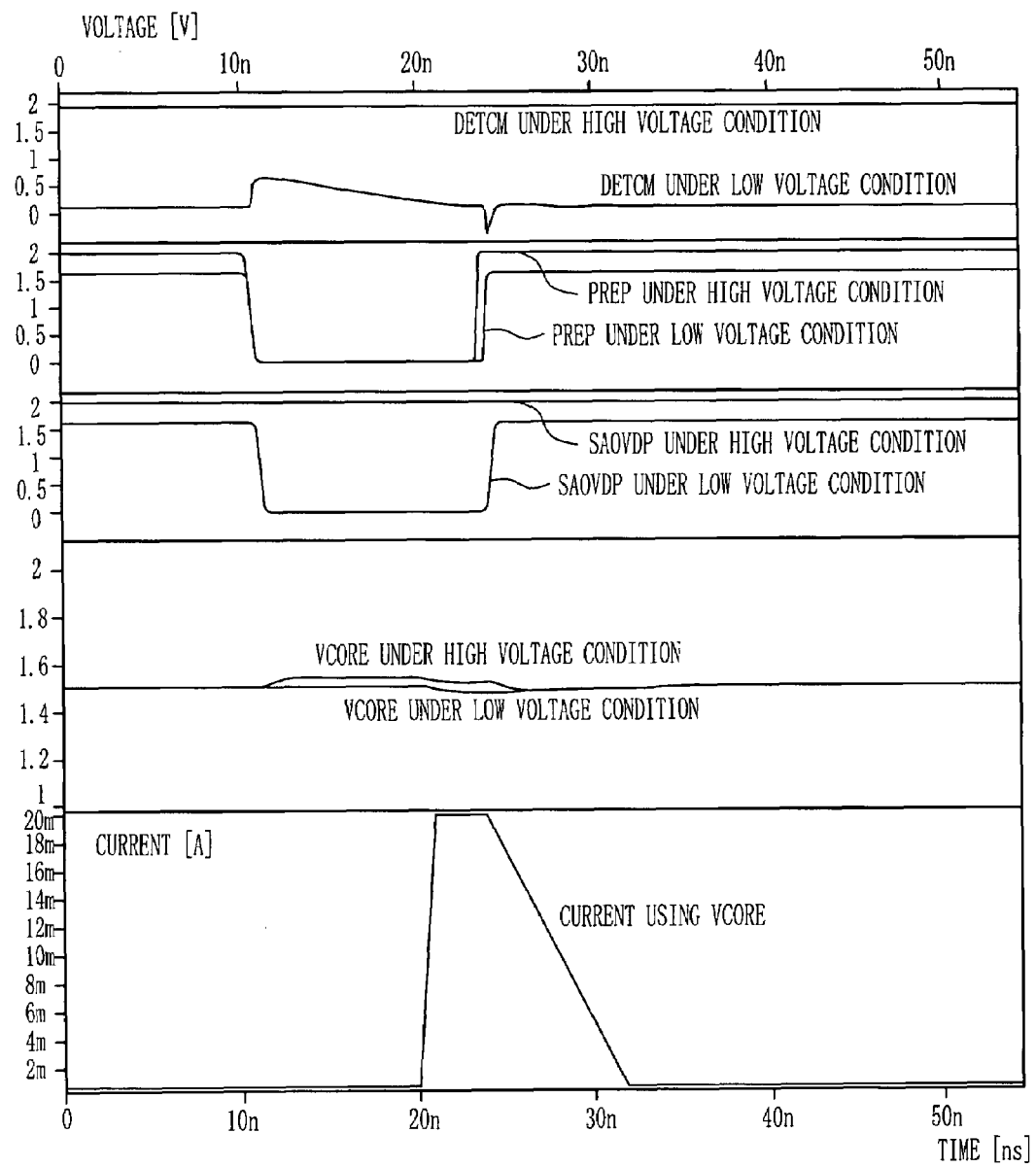
FIG. 11 is a simulation showing voltage and current changes according to an over-driving pulse output from the over-driving pulse generating unit shown in FIG. 10 under various power supply voltage conditions.

FIG. 11 shows a simulation showing voltage and current changes according to the over-driving pulse SAOVDP output from the over-driving pulse generating unit shown in FIG. 10 under various power supply voltage conditions.

It is assumed that a high power supply voltage is given as 2V, i.e., VDD=2V, and a low power supply voltage is 1.6V, i.e., VDD=1.6V, the reference voltage VREF is set to 0.8V to adjust the predetermined ratio of the first resistor R3 to the second resistor R4 such that the output node C of the voltage divider 622 has the same level as the reference voltage VREF, i.e., 0.8V when VDD=1.8V.

When a semiconductor memory device is in an idle state, the over-driving pulse SAOVDP is always deactivated with a logic high level. Thus it is described only when the semiconductor memory device is an active state, i.e., an enable signal EN has a logic high level.

Referring to FIG. 11, under the low voltage condition, i.e., VDD=1.6V, the detecting signal DETCM output from the supply voltage level detecting section 620 has a logic low level. Therefore, the second NOR gate NOR18 of the selecting section 630 acts as an inverter, and as a result the selecting section 630 selects the pulse signal PREP to output it as the over-driving pulse SAOVDP.

As shown in FIG. 11, the pulse signal PREP has a pulse width suitable for low voltage condition as desired to procure a sufficient over-driving interval and thus can fully drive a core voltage stage even under the low voltage condition.

Meanwhile, under the high voltage condition, i.e., VDD=2V, the detecting signal DETCM output from the supply voltage level detecting section 620 has a logic high level. Therefore, the second NOR gate NOR18 of the selecting section 630 blocks the pulse signal PREP and as a result the selecting section 630 deactivates the over-driving pulse SAOVDP to output it as a logic high level.

In such a case, there is no over-driving interval because the over-driver is disabled. However, a current required for operating a bit line sensing amplifier can be fully supplied into RTO since a supply voltage VDD is sufficiently high itself, although the core voltage VCORE is driven by a separate over-driving voltage.

As a result, a voltage level of the core voltage VCORE can be stabilized under both of the low and high voltage conditions.

The present invention described above is not limited by the described embodiments and the accompanying drawings, and it will be apparent to those skilled in the art that various variations, changes and modifications may be made without departing from the true spirit and scope of the invention.

For example, while the preferred embodiments have been described by way of illustrating an over-driving scheme in which a normal driver drives the RTO and an over-driver drives a core voltage stage, the present invention can be also adapted into a case where the over-driver and the normal driver parallel drive the RTO.

Further, while the present embodiments have been described by way of illustrating a case where a core voltage VCORE is used as a normal driving voltage and a supply voltage VDD is used as an over-driving voltage, it is possible to apply another voltage thereto instead of the normal driving voltage and the over-driving voltage.

Moreover, while the preferred embodiments have been described by way of illustrating a selecting section implemented by using only logical gates, it is possible to implement the selecting section by using two transmission gates.

In addition, the logical gates and transistors may be differently implemented in compliance with the polarity of a signal to be inputted.

The present invention described above has advantages of procuring a stable over-driving operation without respect to a supply voltage VDD level and thus reducing operational characteristics and defects in a semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. An over-driver control signal generating apparatus, comprising:
   a pulse generating unit for generating a pulse signal having a pulse width corresponding to a desired over-driving interval in response to an over-driving signal;
   a supply voltage level detecting unit for detecting a voltage level of a supply voltage to generate a detecting signal; and
   a selecting unit for outputting the pulse signal as a bit line over-driver control signal in response to the detecting signal.

2. The apparatus of claim 1, wherein the pulse generating unit includes:
   a first pulse generator for generating a first pulse signal having a first pulse width in response to the over-driving signal; and
   a second pulse generator for generating a second pulse signal having a second pulse width shorter than the first pulse width in response to the over-driving signal.

3. The apparatus of claim 2, wherein the first pulse generator includes:
   a delay for delaying the over-driving signal; and
   a NOR gate for performing a NOR operation on the over-driving signal and an output signal of the delay to output the first pulse signal.

4. The apparatus of claim 2, wherein the second pulse generator includes:
   a delay for delaying the over-driving signal; and
   a NAND gate for performing a NAND operation on the over-driving signal and an inverted signal of an output signal of the delay to output the second pulse signal.

5. The apparatus of claim 2, wherein the supply voltage level detecting unit includes:
   a voltage divider for dividing the supply voltage by a predetermined ratio; and
   a comparator for comparing an output signal of the voltage divider and a reference voltage in response to an enable signal.

6. The apparatus of claim 5, wherein the voltage divider has a first resistor and a second resistor connected in series between the supply voltage and a ground voltage.

7. The apparatus of claim 6, wherein the comparator has an NMOS bias type of current mirror differential amplifier circuit for receiving the output signal of the voltage divider and the reference voltage as differential inputs.

8. The apparatus of claim 2, wherein the selecting unit includes:
   a first NAND gate for performing a NAND operation on an inverted signal of the detecting signal and the first pulse signal;
   a first inverter for inverting an output signal of the first NAND gate;
   a second NAND gate for performing a NAND operation on the detecting signal and the second pulse signal;
   a second inverter for inverting an output signal of the second NAND gate;
   a NOR gate for performing a NOR operation on output signals of the first and second inverters; and
   a third NAND gate for performing a NAND operation on an output signal of the NOR gate and the enable signal to output the over-driver control signal.

9. The apparatus of claim 1, wherein the pulse generating unit includes:
   a delay for delaying the over-driving signal; and
   a first NOR gate for receiving the over-driving signal and an output of the delay to output the pulse signal.

10. The apparatus of claim 9, wherein the supply voltage level detecting unit includes:
    a voltage divider for dividing the supply voltage by a predetermined ratio; and
    a comparator for comparing an output signal of the voltage divider and a reference voltage in response to an enable signal.

11. The apparatus of claim 10, wherein the voltage divider has a first resistor and a second resistor connected in series between the supply voltage and a ground voltage.

12. The apparatus of claim 10, wherein the comparator has an NMOS bias type of current mirror differential amplifier circuit for receiving the output signal of the voltage divider and the reference voltage as differential inputs.

13. The apparatus of claim 9, wherein the selecting unit includes:
    a second NOR gate for performing a NOR operation on the detecting signal and the pulse signal; and
    an inverter for receiving an output signal of the second NOR gate to output the bit line over-driver control signal.

14. An over-driver control signal generating method, comprising:
    generating a first pulse signal having a first pulse width in response to the over-driving signal;
    generating a second pulse signal having a second pulse width shorter than the first pulse width in response to an over-driving signal;
    detecting a voltage level of a supply voltage; and
    alternatively outputting the first pulse signal or the second pulse signal as a bit line over-driver control signal in response to a detected result of the supply voltage.

15. The method of claim 14, wherein in the step of alternatively outputting the first pulse signal or the second pulse signal, the first pulse signal is selected as the bit line over-driver control signal under low voltage condition and the second pulse signal is selected as the bit line over-driver control signal under high voltage condition.

16. The method of claim 14, wherein the step of detecting the voltage level of the supply voltage includes:
    dividing the supply voltage by a predetermined ratio; and
    comparing the divided voltage and a reference voltage in response to an enable signal.

17. An over-driver control signal generating method, comprising:
    generating a pulse signal having a pulse width corresponding to a desired over-driving interval in response to an over-driving signal;
    detecting a voltage level of a supply voltage; and
    outputting the pulse signal as a bit line over-driver control signal in response to a detected result of the supply voltage.

18. The method of claim 17, wherein in the step of outputting the pulse signal as the bit line over-driver control signal, the pulse signal is output as the bit line over-driver control signal under low voltage condition and the over-driver control signal is deactivated and output under high voltage condition.

19. The method of claim 17, wherein the step of detecting the voltage level of the supply voltage includes:
    dividing the supply voltage by a predetermined ratio; and
    comparing the divided voltage and a reference voltage in response to an enable signal.

* * * * *